United States Patent
Joshi et al.

(10) Patent No.: US 7,477,516 B2
(45) Date of Patent: Jan. 13, 2009

(54) AIR COOLED COMPUTER CHIP

(75) Inventors: Shrikant Mukund Joshi, Williamsville, NY (US); Mohinder Singh Bhatti, Amherst, NY (US)

(73) Assignee: Delphi Technologies, Inc., Troy, MI (US)

( * ) Notice: Subject to any disclaimer, the term of this patent is extended or adjusted under 35 U.S.C. 154(b) by 243 days.

(21) Appl. No.: 11/505,724

(22) Filed: Aug. 17, 2006

(65) Prior Publication Data

US 2008/0043433 A1 Feb. 21, 2008

(51) Int. Cl.
*H05K 7/20* (2006.01)
*A47B 77/08* (2006.01)
*H05K 5/00* (2006.01)
*H01L 23/34* (2006.01)

(52) U.S. Cl. ................... 361/702; 361/695; 361/696; 454/184; 312/236; 165/80.3; 257/721; 174/16.3

(58) Field of Classification Search ......... 361/694–696, 361/702, 703; 454/184; 312/236; 257/721–722; 165/80.3; 174/16.1, 16.3
See application file for complete search history.

(56) References Cited

U.S. PATENT DOCUMENTS

| | | | | |
|---|---|---|---|---|
| 4,417,295 A * | 11/1983 | Stuckert | ..................... | 361/694 |
| 5,566,377 A * | 10/1996 | Lee | .............................. | 361/695 |
| 6,021,042 A * | 2/2000 | Anderson et al. | ........... | 361/695 |
| 6,134,108 A * | 10/2000 | Patel et al. | .................. | 361/695 |
| 6,332,758 B1 * | 12/2001 | Tang et al. | ................... | 417/354 |
| 6,525,935 B2 * | 2/2003 | Casebolt | ..................... | 361/687 |
| 6,525,936 B2 * | 2/2003 | Beitelmal et al. | ........... | 361/695 |
| 6,574,100 B1 * | 6/2003 | Anderson | ..................... | 361/687 |
| 6,628,520 B2 * | 9/2003 | Patel et al. | .................... | 361/696 |
| 6,876,549 B2 * | 4/2005 | Beitelmal et al. | ........... | 361/692 |
| 6,904,968 B2 * | 6/2005 | Beitelmal et al. | ........... | 165/247 |
| 7,013,968 B2 * | 3/2006 | Beitelmal et al. | ........... | 165/244 |
| 7,021,891 B2 * | 4/2006 | Sanchez et al. | ............... | 415/98 |
| 7,248,472 B2 * | 7/2007 | Vinson et al. | ............... | 361/694 |
| 7,345,873 B2 * | 3/2008 | Dey et al. | .................... | 361/695 |
| 7,361,081 B2 * | 4/2008 | Beitelmal et al. | ........... | 454/184 |
| 2007/0091565 A1 * | 4/2007 | Malone et al. | .............. | 361/695 |

* cited by examiner

*Primary Examiner*—Jayprakash N Gandhi
*Assistant Examiner*—Zachary M Pape
(74) *Attorney, Agent, or Firm*—Patrick M. Griffin

(57) ABSTRACT

A cooling assembly includes a housing supporting a nozzle for directing cooling air over an electronic component. A casing rotatably supports a shaft, which in turn, supports a compressor, an expander, and an electric motor, for circulating air and delivering the cooling air to the nozzle. The assembly is distinguished by air bearings supporting the shaft in the casing on a thin film of air, thereby maintaining a contaminate free housing.

13 Claims, 4 Drawing Sheets

AIR COOLED COMPUTER CHIP

BACKGROUND OF THE INVENTION

1. Field of the Invention

The subject invention relates to a cooling assembly for cooling an electronic component with direct air.

2. Description of the Prior Art

The operating speed of computers is constantly being improved to create faster computers. With this, comes increased heat generation and a need to effectively dissipate that heat.

Heat exchangers and heat sink assemblies have been used that apply natural or forced convection cooling methods to dissipate heat from electronic devices that are highly concentrated heat sources such as microprocessors and computer chips. The most common method of cooling computer chips has been direct air cooling, which is adequate for the moderate thermal load generated by the chip. These heat exchangers typically use air to directly remove heat from the electronic devices; however air has a relatively low heat capacity. Thus, liquid-cooled units called LCUs employing a cold plate in conjunction with high heat capacity fluids have been used to remove heat from these types of heat sources. Although LCUs are satisfactory for moderate heat flux, increasing computing speeds have required more effective heat sink assemblies.

Accordingly, thermosiphon cooling units (TCUs) have been used for cooling electronic devices having a high heat flux. A typical TCU absorbs heat generated by the electronic device by vaporizing the working fluid housed on the boiler plate of the unit. The boiling of the working fluid constitutes a phase change from liquid-to-vapor state and as such the working fluid of the TCU is considered to be a two-phase fluid. The vapor generated during boiling of the working fluid is then transferred to a condenser, where it is liquefied by the process of film condensation over the condensing surface of the TCU. The heat is rejected into a stream of air flowing through a tube running through the condenser or flowing over fins extending from the condenser. Alternatively, a second refrigerant can flow through the tube increasing the cooling efficiency. The condensed liquid is returned back to the boiler plate by gravity to continue the boiling-condensing cycle.

In recent years the generation of higher thermal load is being handled by improving the chip design such that even with higher computing speeds the chip does not generate large amounts of heat. Thus, chip cooling can be handled by air cooling without having to resort to LCUs or TCUs. Although the prior art dissipates heat from electronic devices, as computing speeds increase, there is a continuing need for cooling assemblies having more efficient or alternative heat transfer capabilities as compared to the conventional electronic cooling assemblies.

SUMMARY OF THE INVENTION AND ADVANTAGES

The invention provides a cooling assembly for cooling an electronic component with direct air. The assembly includes a housing and at least one electronic component disposed in the housing. A nozzle is supported in the housing and directs cooling air over the electronic component. An open air cycle cooling unit is disposed in the housing and supplies the cooling air to the nozzle. The cooling unit includes a casing and a compressor rotatably supported by the casing for moving air. The assembly is distinguished by having air bearings that support the compressor in the casing on a thin film of air, thereby maintaining a contaminate free housing.

Accordingly, the subject invention provides an enhanced air cooling assembly. The open air cycle cooling unit is housed inside the computer case or housing, and enhances the cooling efficiency. With no oil introduced into the air stream, the open air cycle cooling unit is ideal for cooling electronic components.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
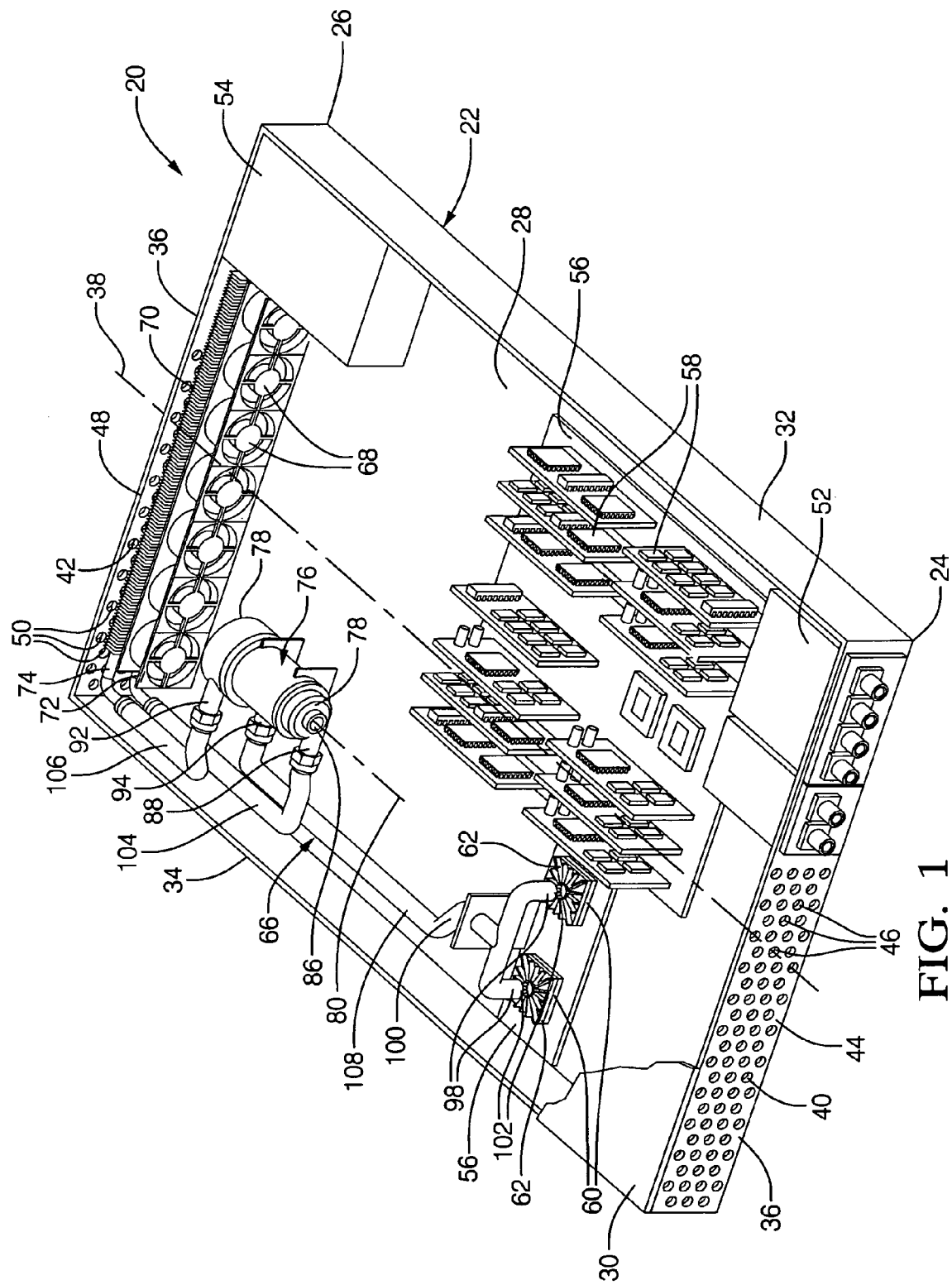
FIG. 1 is a perspective view of the subject invention.
Figure 2:
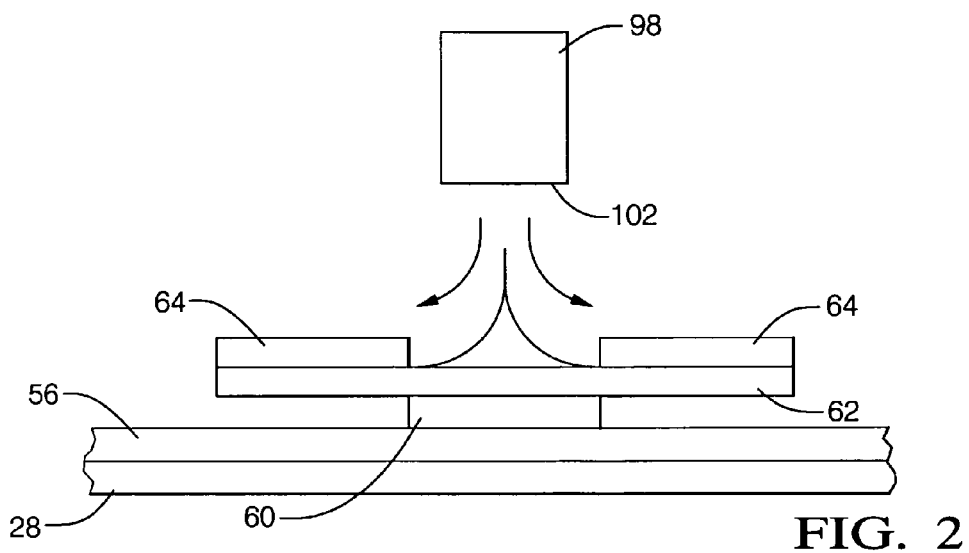
FIG. 2 is an schematic view of air being directed over an electronic chip in the subject invention.
Figure 3:
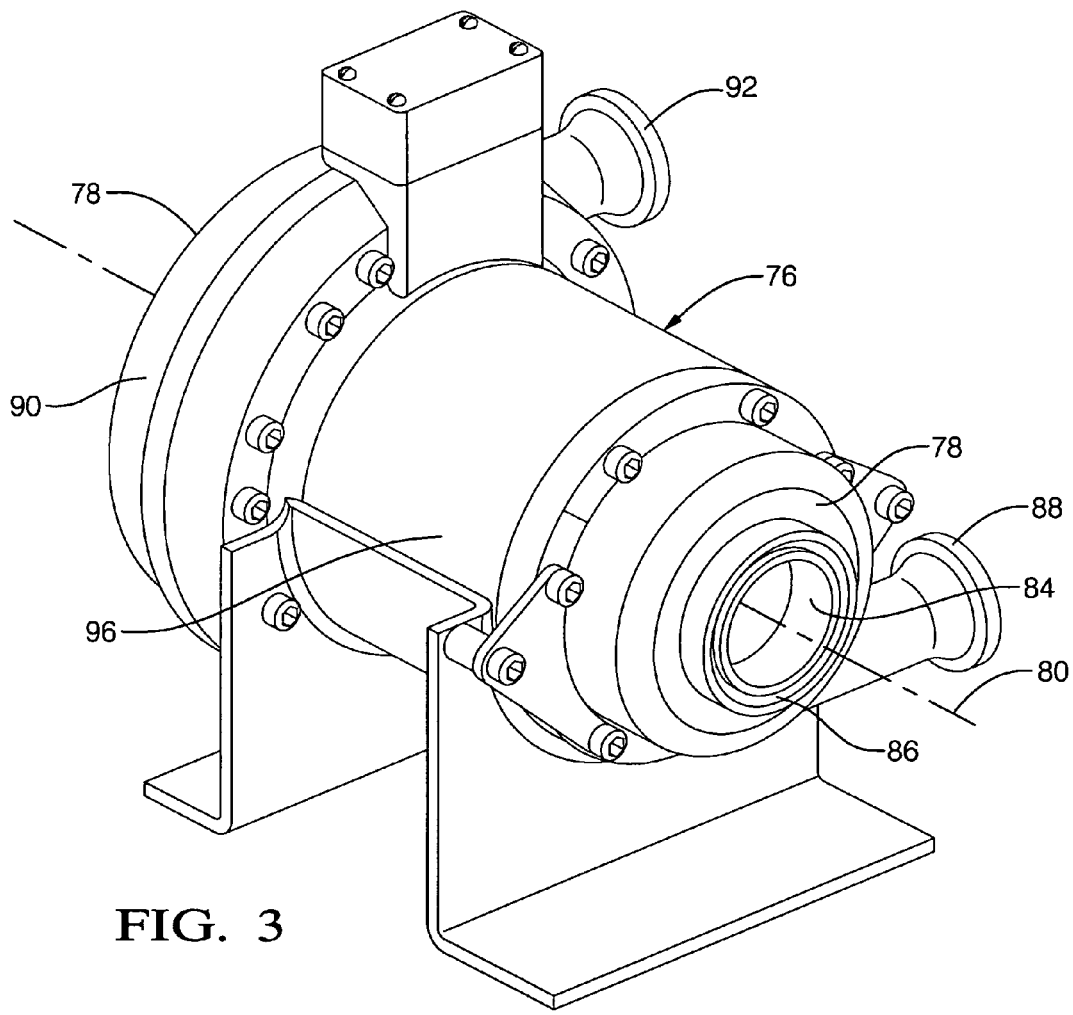
FIG. 3 is a perspective view of a casing utilized for the air cycle cooling unit in the subject invention.
Figure 4:
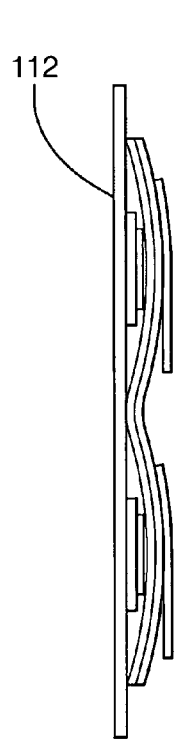
FIG. 4 is a side view of a thrust bearing utilized in the subject invention.
Figure 5:
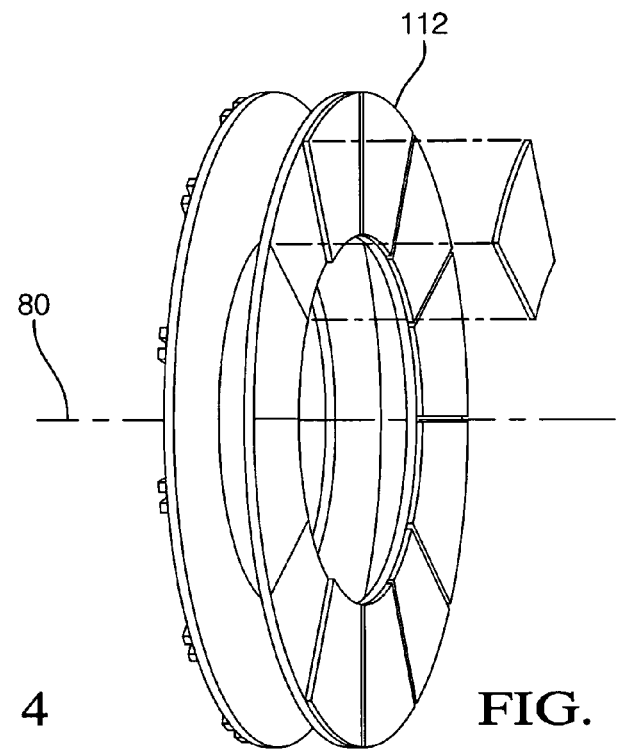
FIG. 5 is an exploded view of a thrust bearing utilized in the subject invention.
Figure 6:
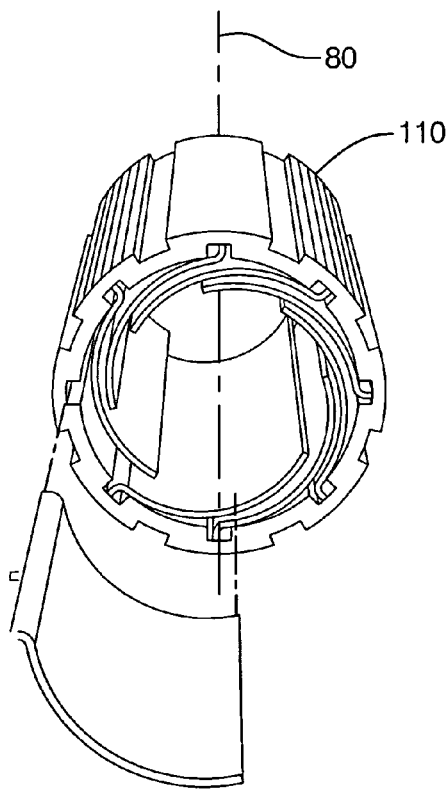
FIG. 6 is an exploded view of a journal bearing utilized in the subject invention.
Figure 7:
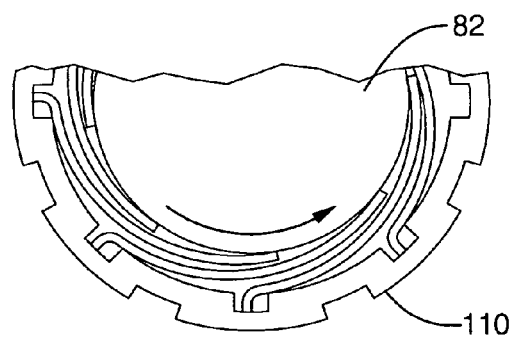
FIG. 7 is a fragmentary end view partially broken away and in cross section of the journal bearing shown in FIG. 6.
Figure 8:
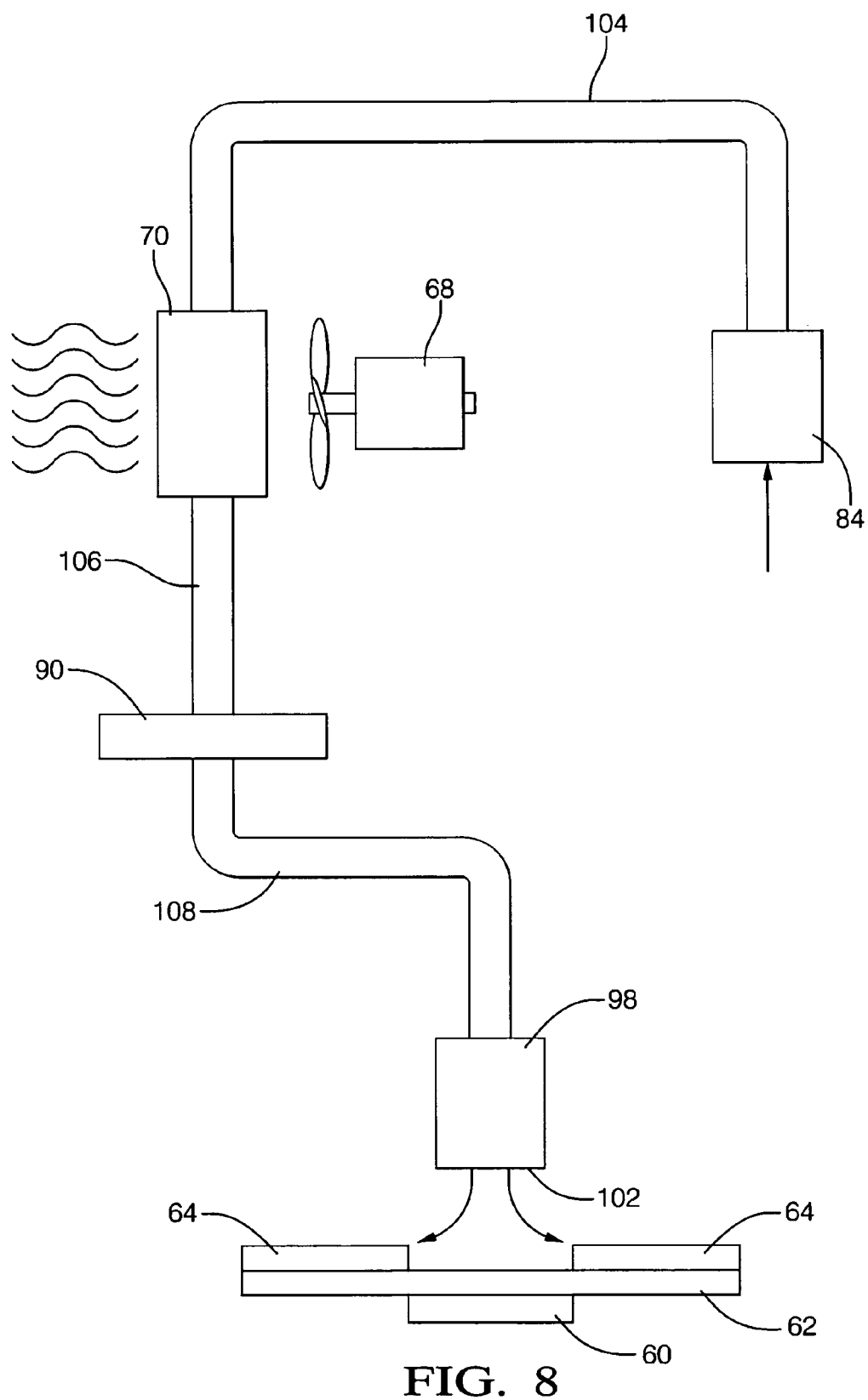
FIG. 8 is a schematic of the air cycle cooling unit utilized in the subject invention.

Referring to the Figures, wherein like numerals indicate corresponding parts throughout the several views, a cooling assembly 20 is generally shown for cooling an electronic component with direct air in FIGS. 1-4.

The subject invention comprises a housing 22 generally indicated which has a generally rectangular periphery that defines four corners 24, 26 (only the first and second of the four corners are numbered). The housing 22 is typically made of metal, but may be any other material known in the art. The housing 22 includes a housing bottom 28 and a housing top 30 with spaced and parallel side walls 32, 34. The side walls 32, 34 are solid and extend between the housing bottom 28 and the housing top 30. The housing 22 further includes opposite housing ends 36 and a longitudinal housing axis 38. The housing bottom 28, the side walls 32, 34, and the housing top 30 extend axially between the housing ends 36 to define an air entrance 40 at one of the housing ends 36 and an air exit 42 at the other of the housing ends 36. The air entrance 40 and air exit 42 allow for the flow of air through the housing 22.

An entrance plate 44 is disposed at the air entrance 40. The entrance plate 44 has a plurality of entrance apertures 46 for the flow of air through the air entrance 40. The air entrance 40 is typically made of metal, but may be any other material known in the art.

An exit plate 48 is disposed at the air exit 42. The exit plate 48 has a plurality of exit apertures 50 for the flow of air through the air exit 42. The air exit 42 is typically made of metal, but may be any other material known in the art.

A first electronics box 52 is disposed at a first corner 24 adjacent a first side wall 32 and the air entrance 40 for providing electric signals to the assembly 20. A second electronics box 54 is disposed at a second corner 26 adjacent the first side wall 32 and the air exit 42 for providing electric signals to the assembly 20.

The assembly 20 further includes a plurality of electronic components disposed within the housing 22. The electronic components including a mother board 56 disposed on the housing bottom 28, a plurality of circuits 58 disposed on the mother board 56, and a plurality of electronic chips 60 disposed on the mother board 56. A plurality of cold plates 62 having a plurality of heat transfer fins 64 are disposed on the chips 60.

The assembly 20 further includes an open air cycle cooling unit 66 generally indicated that is disposed in the housing 22 for cooling the air that cools the electronic components. The cooling unit 66 includes a plurality of fans 68 that are disposed side-by-side between the second electronics box 54 and a second side wall 34. The fans 68 are parallel to the exit plate 48 and move air through the exit apertures 50 in the exit plate 48.

The cooling unit 66 includes a heat exchanger 70 for cooling air. The heat exchanger 70 is disposed between and parallel to the plurality of fans 68 and the exit plate 48. The heat exchanger 70 includes a heat exchanger inlet 72 and a heat exchanger outlet 74 for the flow of hot compressed air through the heat exchanger 70. The cooling unit 66 further includes a casing 76 generally indicated having opposite casing ends 78 and a casing axis 80 extending parallel to the housing axis 38. The casing 76 is supported on the housing bottom 28 between the plurality of fans 68 and the air entrance 40. A shaft 82 is rotatably supported along the casing axis 80 between the casing ends 78.

A compressor 84 is mounted on the shaft 82 at the one of the casing ends 78 nearer the air entrance 40. The compressor 84 has a compressor inlet 86 and a compressor outlet 88 for establishing the flow of air through the heat exchanger 70. An expander 90 is mounted on the shaft 82 at the one of the casing ends 78 nearer the air exit 42. The expander 90 reduces the pressure of air that flows through the expander 90 and rotates the shaft 82. The expander 90 has an expander inlet 92 and an expander outlet 94 for the flow of air through the expander 90. An electric motor 96 rotates the shaft 82 and is disposed in the casing 76 between the compressor 84 and the expander 90.

The cooling unit 66 further includes a nozzle 98 that distributes air over the cold plates 62. The nozzle 98 includes a nozzle inlet 100 and a plurality of nozzle outlets 102 disposed over the cold plates 62.

A first air tube 104 interconnects the compressor outlet 88 to the heat exchanger inlet 72 for the flow of air therebetween. A second air tube 106 interconnects the heat exchanger outlet 74 to the expander inlet 92 for the flow of air therebetween. A third air tube 108 interconnects the expander outlet 94 to the nozzle inlet 100 for the flow of air therebetween.

The subject invention is distinguished by air bearings 110, 112 that support the shaft 82 on a thin film of air and thus maintain a contaminate free air stream. The air bearings 110, 112 are self-actuated hydrodynamic air bearings 110, 112 and require no source of compressed air. The air bearings 110, 112 include a plurality of journal bearings 110 that support the radial load of the shaft 82 and a plurality of thrust bearings 112 that support the axial load of the shaft 82.

As air enters the compressor inlet 86 air is compressed. The volume of the compressed air is reduced and the temperature increases. The hot compressed air exits the compressor outlet 88 into the first air tube 104 where it flows to the heat exchanger inlet 72. The hot compressed air flows through the heat exchanger 70 where it is cooled by the fans 68. The fans 68 move air through a plurality of spaced fins on the heat exchanger 70. The cooled air exits the heat exchanger 70 through the heat exchanger outlet 74 into the second air tube 106 where it flows to the expander inlet 92. The volume of the cooled air is expanded and the temperature of the cooled air is further reduced. The cooled air exits the expander outlet 94 into the third air tube 108 where it moves to the nozzle inlet 100. The cooled air is distributed over the electronic component by the nozzle outlet 102 that is placed over the electronic component to be cooled.

The subject invention may include a water separator, which is generally located at the heat exchanger outlet 74. The need of a water separator can be eliminated by controlling the temperature of the air coming out of the expander 90 just above the dew point temperature of the air entering the compressor 84. The temperature can be controlled through the use of a controls system that monitors the temperature of the air exiting the expander 90.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A cooling assembly for cooling an electronic component with direct air comprising;
    a housing,
    at least one electronic component disposed in said housing,
    a nozzle supported in said housing for directing cooling air over said electronic component,
    an open air cycle cooling unit disposed in said housing for supplying the cooling air to said nozzle,
    said cooling unit including a casing and a compressor rotatably supported by said casing for moving air, wherein said casing includes opposite casing ends and a casing axis extending therebetween, a shaft extending along said casing axis between said shaft and said compressor being supported on said shaft, said air bearings being between said shaft and said casing,
    air bearings supporting said compressor in said casing on a thin film of air for maintaining a contaminate free housing,
    an electric motor disposed in said casing for rotating said shaft, and
    an expander supported on said shaft for reducing pressure of air that flows through said expander.

2. An assembly as set forth in claim 1 wherein said expander is connected to said shaft for rotating said shaft.

3. An assembly as set forth in claim 2 wherein said cooling unit includes a heat exchanger having a heat exchanger inlet and a heat exchanger outlet, said nozzle includes a nozzle inlet and at least one nozzle outlet disposed over said electronic component, said compressor includes a compressor inlet and a compressor outlet, said expander includes an expander inlet and an expander outlet, said cooling unit includes a first air tube interconnecting said compressor outlet to said heat exchanger inlet for the flow of air therebetween and a second air tube interconnecting said heat exchanger outlet to said expander inlet for the flow of air therebetween and a third air tube interconnecting said expander outlet to said nozzle inlet for the flow of air therebetween.

4. An assembly as set forth in claim 3 wherein said housing includes opposite housing ends and a housing bottom and a housing top with spaced and parallel side walls being solid and extending between said housing bottom and said housing top, a housing axis extending parallel to said casing axis, said housing bottom and said side walls and said housing top extending axially between said housing ends to define an air entrance at one of said housing ends and an air exit at the other of said housing ends to allow the flow of air through said housing.

5. An assembly as set forth in claim 4 wherein said cooling unit includes a plurality of fans disposed side-by-side and parallel to said air exit for moving air out said air exit, said heat exchanger being disposed between said plurality of fans and said air exit, said casing being supported on said housing bottom between said plurality of fans and said air entrance.

6. An assembly as set forth in claim 5 including a plurality of electronic components and a plurality of nozzle outlets disposed over said plurality of electronic components for distributing air over said electronic components.

7. An assembly as set forth in claim 6 including an entrance plate disposed at said air entrance and an exit plate disposed at said air exit, said entrance plate and said exit plate having a plurality of apertures for the flow of air through said air entrance and said air exit.

8. An assembly as set forth in claim 7 wherein said housing includes a generally rectangular periphery to define four corners, a first electronics box disposed at a first corner adjacent a first side wall and said air entrance for providing electric signals to said assembly, a second electronics box disposed at a second corner adjacent said first side wall and said air exit for providing electric signals to said assembly, and wherein said plurality of fans are disposed between said second electronics box and a second side wall.

9. An assembly as set forth in claim 8 wherein said electronic components include a mother board disposed on said housing bottom, a plurality of circuits disposed on said mother board, and a plurality of electronic chips disposed on said mother board.

10. An assembly as set forth in claim 9 including a cold plate having a plurality of heat transfer fins disposed on each of said chips.

11. An assembly as set forth in claim 10 wherein said compressor is supported on said shaft at the one of said casing ends nearer said air entrance, said expander is supported on said shaft at the one of said casing ends nearer said air exit, and said electric motor is disposed between said compressor and said expander.

12. An assembly as set forth in claim 1 wherein said air bearings include a plurality of journal bearings for supporting the radial load of said shaft on air and a plurality of thrust bearings for supporting the axial load of said shaft on air.

13. A cooling assembly for cooling electronic components with direct air comprising;
- a housing of metal and having a generally rectangular periphery to define four corners and including a housing bottom and a housing top with spaced and parallel side walls being solid and extending between said housing bottom and said housing top,
- said housing having opposite housing ends and a housing axis with said housing bottom and said side walls and said housing top extending axially between said housing ends to define an air entrance at one of said housing ends and an air exit at the other of said housing ends to allow the flow of air through said housing,
- an entrance plate of metal and disposed at said air entrance and having a plurality of entrance apertures for the flow of air through said air entrance,
- an exit plate of metal and disposed at said air exit and having a plurality of exit apertures for the flow of air through said air exit,
- a first electronics box disposed at a first corner adjacent a first side wall and said air entrance for providing electric signals to said assembly,
- a second electronics box disposed at a second corner adjacent said first side wall and said air exit for providing electric signals to said assembly,
- a plurality of electronic components disposed within said housing,
- said components including a mother board disposed on said housing bottom,
- said components including a plurality of circuits disposed on said mother board,
- said components including a plurality of electronic chips disposed on said mother board,
- a plurality of cold plates having a plurality of heat transfer fins disposed on said chips,
- an open air cycle cooling unit disposed in said housing for cooling the air that cools said electronic components,
- said cooling unit including a plurality of fans disposed side-by-side between said second electronics box and a second side wall and parallel to said exit plate for moving air through said exit plate,
- said cooling unit including a heat exchanger for cooling air and disposed between said plurality of fans and said exit plate and including a heat exchanger inlet and a heat exchanger outlet for the flow air through said heat exchanger,
- said cooling unit including a casing having opposite casing ends and a casing axis extending parallel to said housing axis and supported on said housing bottom between said plurality of fans and said air entrance,
- a shaft being rotatably supported along said casing axis between said casing ends,
- a compressor mounted on said shaft at the one of said casing ends nearer said air entrance and having a compressor inlet and a compressor outlet for compressing air,
- a expander mounted on said shaft at the one of said casing ends nearer said air exit and having an expander inlet and an expander outlet for reducing the pressure of air that flows through said expander and for rotating said shaft,
- an electric motor disposed between said compressor and said expander in said casing for rotating said shaft,
- said cooling unit including a nozzle having a nozzle inlet and a plurality of nozzle outlets disposed over said cold plates for distributing air over said cold plates,
- a first air tube interconnecting said compressor outlet to said heat exchanger inlet for the flow of air therebetween,
- a second air tube interconnecting said heat exchanger outlet to said expander inlet for the flow of air therebetween,
- a third air tube interconnecting said expander outlet to said nozzle inlet for the flow of air therebetween, and
- air bearings supporting said shaft on a thin film of air for maintaining a contaminate free air stream,
- said air bearings including a plurality of journal bearings for supporting the radial load of said shaft and a plurality of thrust bearings for supporting the axial load of said shaft.

* * * * *